United States Patent [19]

Yamamoto et al.

[11] Patent Number: 5,468,806
[45] Date of Patent: Nov. 21, 1995

[54] METHOD OF MANUFACTURING AN OXIDE SUPERCONDUCTOR THIN FILM

[75] Inventors: Kiyoshi Yamamoto; Nobuyuki Sugii; Koichi Kubo; Michiharu Ichikawa; Hisao Yamauchi, all of Tokyo, Japan

[73] Assignees: The Furukawa Electric Co., Ltd.; Hitachi Ltd., both of Tokyo; Kabushiki Kaisha Toshiba, Kawasaki; Central Research Institute of Electric Power Industry; International Superconductivity Technology Center, both of Tokyo, all of Japan

[21] Appl. No.: 347,847

[22] Filed: Dec. 1, 1994

Related U.S. Application Data

[63] Continuation of Ser. No. 53,463, Apr. 27, 1993, abandoned.

[30] Foreign Application Priority Data

Apr. 24, 1992 [JP] Japan .................................. 4-106717

[51] Int. Cl.$^6$ ................................................. C30B 25/16
[52] U.S. Cl. ......................... 505/238; 505/473; 505/474; 505/475; 505/729; 505/730; 117/84
[58] Field of Search .................................. 505/238, 473, 505/474, 475, 729, 730, 731, 732; 117/84

[56] References Cited

FOREIGN PATENT DOCUMENTS

| 0276746A2 | 1/1988 | European Pat. Off. . | |
| 0345441 | 12/1989 | European Pat. Off. . | |
| 3834963 | 8/1989 | Germany | 505/729 |
| 4104592 | 8/1992 | Germany | 505/729 |
| 64-76915 | 3/1989 | Japan | 505/779 |
| 2-267102 | 10/1990 | Japan | 505/729 |

OTHER PUBLICATIONS

Sugii et al., "Superconducting Thin Films of Infinite-Layer $Sr_{1-x}Nd_xCuO_y$ Synthesized by Pulsed-Laser Deposition, "Jpn. J. Appl. Phys. vol. 31 (1992) Aug. 1, 1992 pp. L1024–L1026.

Niu et al. "Growth of the Infinite Layer Phase of $Sr_{1-x}Nd_xCuO_2$ by Laser Ablation", Applied Physics Letters 61(14) Oct. 1992 pp. 1712–1714.

Myoren, H. et al., "Crystalline Qualities and Critical Current Densities of As–Grown $Ba_2YCu_3O_x$ Thin Film on Silicon with Buffer Layers", Japn. J. Appl. Phys. vol. 29, No. 6, Jun. 1990, pp. L955–L957 (Exhibit 3).

Robert J. Cava, *Parent Structure Superconducts*, Nature, vol. 351, pp. 518–519 (1991).

Nobuyuki Sugii et al., *Growth of $Sr_{1-x}Nd_xCuO_y$ Thin Films by RF–Magnetron Sputtering and Their Crystallographic Properties*, Physica C, vol. 196, pp. 129–134 (1992).

H. Adachi et al., *Superconducting (Sr, Nd)$CuO_y$ Thin Films with Infinite–Layer Structure*, Physica C, vol. 196, pp. 14–16 (1992).

M. Ichikawa et al., *Preparation of Infinite–Layer Structural [sic] (Sr,Nd)$CuO_y$ Thin Films*, IEEE Transactions on Applied Superconductivity, vol. 3, pp. 1571–1574 (1993).

M. G. Smith et al., *Electron–Doped Superconductivity at 40K in the Infinite–Layer Compound $Sr_{1-y}Nd_yCuO_2$*, Nature, vol. 351, pp. 549–551 1991.

*Primary Examiner*—Robert Kunemund
*Attorney, Agent, or Firm*—John P. White

[57] ABSTRACT

Disclosed is a method of manufacturing a thin film of an oxide superconductor represented by formula $Sr_{1-x}Nd_xCuO_2$ on a substrate. The oxide superconductor has a tetragonal crystal structure, the lattice constant in a-axis falling within a range of between 0.385 nm and 0.410 nm, and the lattice constant in c-axis being an integer number of times as much as a level falling within a range of between 0.310 nm and 0.350 nm. The method includes the steps of forming by epitaxial growth a film of a crystal having lattice constants close to those of the crystal of said oxide superconductor on a substrate, and forming a thin film of the oxide superconductor of a tetragonal crystal structure represented by general formula (I) by a thin film-forming technique.

19 Claims, 2 Drawing Sheets

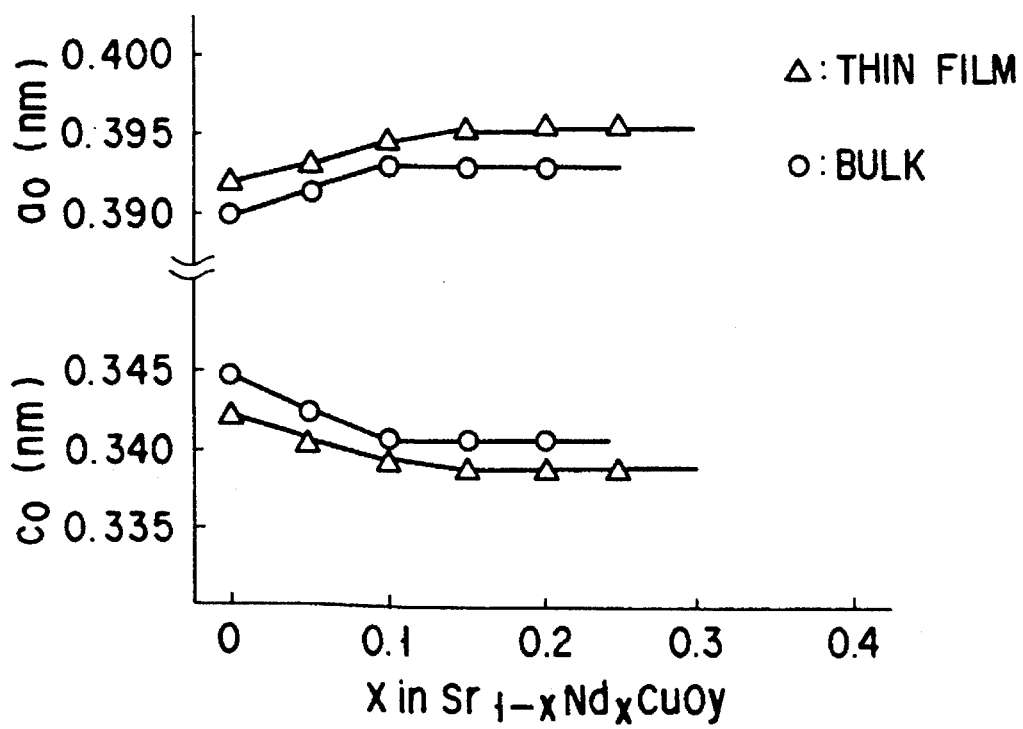
F I G. 1
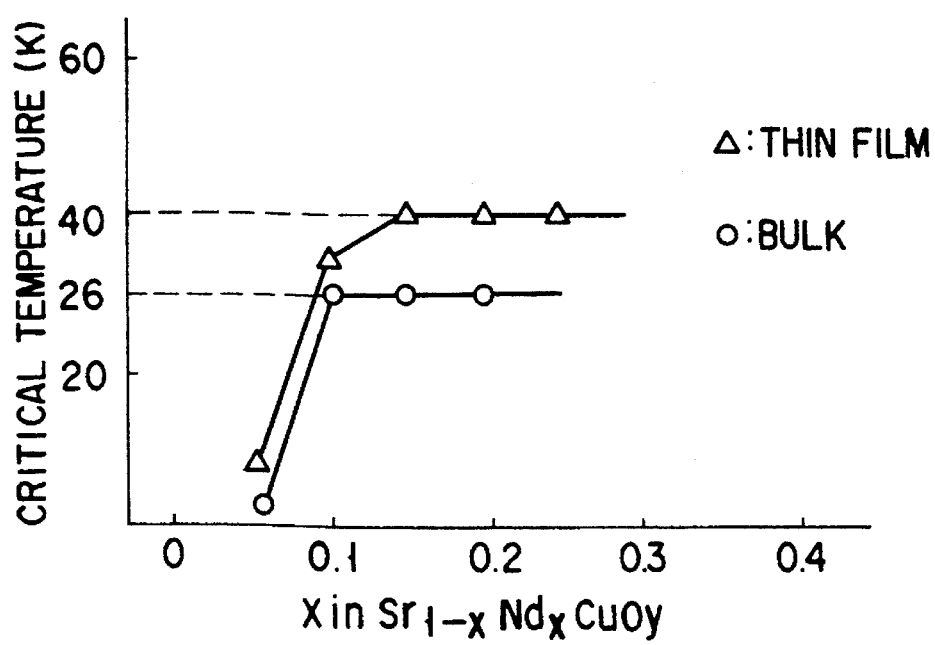
F I G. 2

5,468,806

METHOD OF MANUFACTURING AN OXIDE SUPERCONDUCTOR THIN FILM

This is a continuation of application Ser. No. 08/053,463, filed Apr. 27, 1993 now abandoned.

BACKGROUND OF THE INVENTION

1. Field of the Invention

The present invention relates to a method of manufacturing an oxide superconductor thin film which permits controlling the critical temperature of the superconductor.

2. Description of the Related Art

In order to use an oxide superconductor in various fields, it is necessary to control the critical temperature which is one of the important characteristics of the oxide superconductor. It was customary in the past to control the critical temperature of the oxide superconductor by controlling the ratio of the element substituting each site of the compositional formula of the oxide superconductor. For substituting the element in each site of the compositional formula, it is known to the art to add a raw material containing the substituting element in preparing a raw material mixture. It is also known to the art to dope an oxide shaped body prepared from the raw material mixture with a suitable dopant.

On the other hand, it is reported in "Nature, Vol. 351, 549–551, by M. G. Smith et al" that a superconductor was prepared from a bulk material of $Sr_{1-x}Nd_xCuO_2$, which is a crystal of tetragonal system. It is reported in this literature that an oxide superconductor of $Sr_{1-x}Nd_xCuO_2$ is manufactured as follows. In the first step, the starting materials of $SrCO_3$, $Nd_2O_3$ and Cu metal, which are mixed at a predetermined mixing ratio to provide a desired chemical composition, are dissolved in nitric acid to dry, thereby obtaining a mixed nitrate. The resultant nitrate is slowly heated to 600° C. to decompose the nitrate. The decomposed nitrate is maintained at 600° C. for one hour. The resultant material is pulverized, mixed and calcined at 600° C. for 3 hours. Then, the calcined material is pulverized and mixed, followed by shaping the resultant powdery material in a desired shape so as to obtain a shaped body. Further, the shaped body is subjected to a heat treatment at 925° C. for 12 to 16 hours, followed by applying an additional heat treatment under a high pressure, i.e., at a temperature of about 1000° C. and a pressure of 25 kbar, to the shaped body for 0.5 hour, quenching the shaped body, and reducing a pressure to ordinary pressure so as to obtain an oxide superconductor of $Sr_{1-x}Nd_xCuO_2$.

In order to control the critical temperature of the $Sr_{1-x}Nd_xCuO_2$ oxide superconductor, it is also necessary to control the substituting ratio of the element.

However, in the method of controlling the substituting ratio of the element, the maximum mixing amount of the raw material containing the substituting element and the maximum doping amount of the dopant are restricted because the ratio of the substituting element is restricted in order to permit the substituting element to be substituted in the desired site while maintaining the crystal structure of the oxide superconductor. Naturally, the upper limit of the critical temperature is determined by the ratio of the substituting element, making it difficult to obtain an oxide superconductor exhibiting a higher critical temperature. It should also be noted that, in the conventional method exemplified above, it is necessary to apply troublesome treatments such as the treatments under a high total pressure or under a high oxygen partial pressure, leading to a low efficiency of the manufacturing process.

SUMMARY OF THE INVENTION

An object of the present invention is to provide a method of manufacturing an oxide superconductor thin film, which makes it possible to obtain easily and without employing an element substitution an oxide superconductor thin film exhibiting a desired critical temperature.

According to the present invention, there is provided a method of manufacturing an oxide superconductor thin film, said oxide superconductor being represented by general formula (I) given below:

$$A_{1-x}B_xCuO_y \quad (I)$$

where "A" is at least one element selected from the group consisting of Ca, Sr and Ba, "B" is at least one rare earth element, "x" falls within a range of between 0 and 0.5, "y" falls within a range of between 1.95 and 2.30, said oxide superconductor having a crystal structure of tetragonal system, the lattice constant in a-axis falling within a range of between 0.385 nm and 0.410 nm, and the lattice constant in c-axis being an integer number of times as much as a level falling within a range of between 0.310 nm and 0.350 nm, said method comprising the steps of:

forming by epitaxial growth a film of a crystal having lattice constants close to those of the crystal of said oxide superconductor on a substrate; and forming a thin film of the oxide superconductor having a crystal structure of tetragonal system and being represented by general formula (I) by a thin film-forming technique.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 is a graph showing the relationship between the lattice constants and the composition of an oxide superconductor $Sr_{1-x}Nd_xCuO_y$ (x falling within a range of between 0 and 0.3);

FIG. 2 is a graph showing the relationship between the critical temperature and the composition of an oxide superconductor $Sr_{1-x}Nd_xCuO_y$ (x falling within a range of between 0 and 0.3);

DETAILED DESCRIPTION OF THE PREFERRED EMBODIMENT

Figure 3:
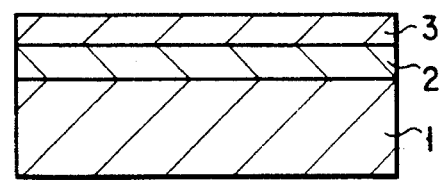
FIG. 3 is a cross sectional view showing an oxide superconductor thin film manufactured by the method of the present invention.

The present inventors have found that, in the method of forming a thin film, it is possible to make the lattice constant of the crystal of the oxide superconductor close to the lattice constant of the crystal of the undercoat film by controlling the lattice constant of the crystal of the undercoat film. For example, it has been found that, if the lattice constant, particularly the length of a-axis, of the crystal of the undercoat film is made longer, the thin film of an oxide superconductor formed on the undercoat film is enabled to form crystals of the lattice constant which were not formed in the bulk process. It follows that it is possible to obtain an oxide superconductor thin film having a critical temperature of a level which cannot be arrived at in the bulk process. In short, the present inventors have arrived at the present invention by utilizing the phenomenon that the critical temperature of the oxide superconductor is affected by the lattice constant of the crystal of the undercoat film.

In the present invention, an epitaxial film is formed on a substrate, followed by forming an oxide superconductor thin film on the epitaxial film. It is desirable for the material of the epitaxial film to be close to the material of the oxide superconductor thin film formed on the epitaxial film in chemical properties and crystal structure. To be more specific, it is desirable to use as a material of the epitaxial film an oxide having a crystal structure of perovskite type as well as an oxide or fluoride having a crystal structure resembling a perovskite crystal structure. In addition, it is important for the material of the epitaxial film to have a lattice constant falling within a range of between 0.385 nm and 0.410 nm. For example, it is desirable to use $Sr_{1-z}Ba_zTiO_3$ and (Ln, Ln')$_2$CuO$_4$ (Ln and Ln' denoting a rare earth element) because the composition and the lattice constant are related to each other in these materials.

The substrate material is not particularly restricted in the present invention as far as an epitaxial growth can be achieved on the surface of the substrate. For example, it is possible to use $SrTiO_3$ having a surface of (100) plane.

In the present invention, it is possible to employ various thin film-forming methods for forming an oxide superconductor thin film on the epitaxial film including, for example, a sputtering method, a laser vapor deposition method, MBE (Molecular Beam Epitaxy) method and a CVD method.

The oxide superconductor used in the present invention is defined to be formed of crystals, the lattice constant in c-axis of said crystal being an integer number of times as much as a level falling within a range of between 0.310 nm and 0.350 nm. The particular definition covers the case where the repeating unit of the crystals in c-axis is a plurality of times as much as a level falling within a range of between 0.310 nm and 0.350 nm.

In the method of the present invention for manufacturing an oxide superconductor thin film, a film of a crystal of a tetragonal crystal structure having lattice constants close to those of the crystal of said oxide superconductor is formed in advance on a substrate by an epitaxial growth technique. Then, a thin film of the oxide superconductor represented by general formula (I) and having a crystal structure of tetragonal system is formed on the epitaxial film by a thin film-forming technique.

The crystal of the oxide superconductor thin film formed on the epitaxial film has a lattice constant close to that of a crystal of the epitaxial film by setting the lattice constant of the crystal of the epitaxial film formed on the substrate at a value close to the lattice constant of the crystal of the oxide superconductor. Thereby, the thin film made of the oxide superconductor having a desired critical temperature is obtained. It follows that it is unnecessary to adjust in advance the lattice constant of the crystal of the oxide superconductor. It is also unnecessary to apply troublesome treatments such as a doping treatment after formation of the oxide superconductor thin film and a heat treatment under a high pressure, which are employed in the bulk process. Let us describe more in detail one embodiment of the present invention with reference to the accompanying drawings.

It has been confirmed by the experiment described below that the critical temperature of the oxide superconductor represented by general formula (I) depends on the lattice constant of the crystal of the oxide superconductor.

In the first step, thin films of $Sr_{1-x}Nd_xCuO_y$ were formed on a $SrTiO_3$ substrate having a surface of (100) plane by an ArF excimer laser abrasion with various sintered pellets used as a target, said sintered pellets having a composition of $Sr_{1-x}Nd_xCuO_y$, x falling within a range of between 0 and 0.3. In forming the thin film, the substrate temperature was set at 650° C., the oxygen partial pressure was set at 20 mTorr, the laser output was set at 1.5 mJ/cm$^2$, and the distance between the target and the substrate was set at 50 mm. The thin films of $Sr_{1-x}Nd_xCuO_y$ thus formed were analyzed by X-ray diffraction, and the lattice constant was measured on the basis of the analytical results. FIG. 1 shows the relationship between the lattice constant and the composition of $Sr_{1-x}Nd_xCuO_y$ together with the lattice constant of $Sr_{1-x}Nd_xCuO_y$ (x=0 to 0.3) obtained by the bulk process published by M. G. Smith et al, which was referred to previously.

As shown in FIG. 1, the thin film of $Sr_{1-x}Nd_xCuO_y$ is substantially equal to the bulk of $Sr_{1-x}Nd_xCuO_y$ in the tendency of the change in the lattice constant with increase in the Nd content x of the material. To be more specific, the length of a-axis is monotonously increased with increase in the Nd content x in each of the thin film and the bulk. On the other hand, the length of c-axis is monotonously decreased with increase in the Nd content x in each of the thin film and the bulk. What should be noted, however, is that the length of a-axis of the crystal in the thin film is more likely to be affected by the length of a-axis of the crystal of $SrTiO_3$ used as the substrate material than the bulk. In other words, the length of a-axis of the crystal in the thin film of $Sr_{1-x}Nd_xCuO_y$ is closer to the length of a-axis of the crystal of $SrTiO_3$ than the length of a-axis of the bulk of $Sr_{1-x}Nd_xCuO_y$. It follows that the a-axis of the crystal in the thin film of $Sr_{1-x}Nd_xCuO_y$ is relatively short, causing the c-axis of the crystal to be relatively long.

The critical temperature was also measured with respect to each of the thin film of $Sr_{1-x}Nd_xCuO_y$ and the bulk of $Sr_{1-x}Nd_xCuO_y$. FIG. 2 shows the relationship between the critical temperature and the composition of $Sr_{1-x}Nd_xCuO_y$. As shown in FIG. 2, the bulk was found to exhibit a critical temperature of 40K where the Nd content x was 0.15, in contrast to 26K for the thin film. It is considered reasonable to understand that the length of a-axis of the crystal forming the thin film of $Sr_{1-x}Nd_xCuO_y$ is affected by the length of a-axis of the crystal of $SrTiO_3$, leading to the above-noted difference in the critical temperature between the thin film and the bulk.

As described above, the lattice constant of the crystal of the oxide superconductor represented by the general formula $A_{1-x}B_xCuO_y$, which is formed on a substrate, is affected by the lattice constant of the crystal of the substrate material. Also, the critical temperature of the oxide superconductor is dependent on the lattice constant of the oxide superconductor. It follows that it is possible to control the critical temperature of the oxide superconductor of this type by adjusting the lattice constant of the crystal of the undercoat material on which the oxide superconductor is deposited.

Figure 4:
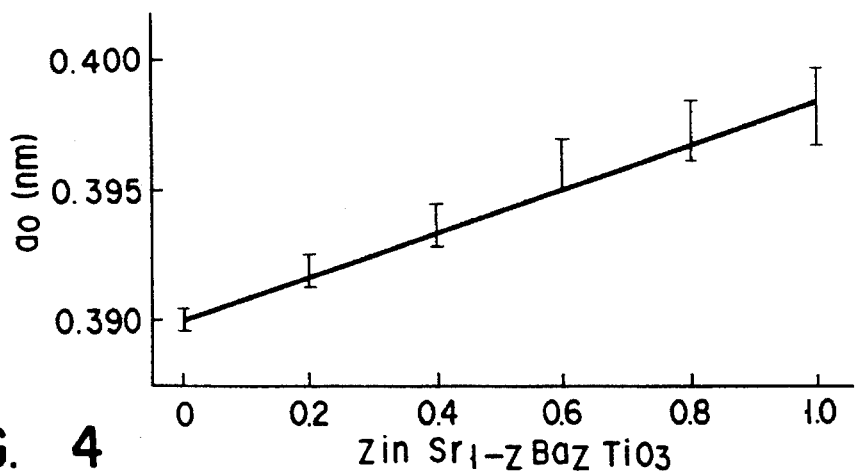
FIG. 4 is a graph showing the relationship between the length of a-axis and the composition of an epitaxial film of $Sr_{1-z}Ba_zTiO_3$ (z falling within a range of between 0 and 1.0)

Let us describe experimental data of the oxide superconductor thin film manufactured by the method of the present invention. In the first step, an epitaxial film 2 having a thickness of 100 nm was formed on a $SrTiO_3$ substrate 1 having a surface of (100) plane by means of an RF magnetron sputtering of $Sr_{1-z}Ba_zTiO_3$, as shown in FIG. 3. The RF magnetron sputtering was carried out by using as a target a sintered pellet of $Sr_{1-z}Ba_zTiO_3$ having an outer diameter of 90 mm. The substrate temperature was set at 650° C. The pressure within the RF sputtering apparatus was set at 5 mTorr. The distance between the target and the substrate was set at 45 mm. The RF power was set at 100 W. Further, the gas introduced into the RF sputtering apparatus was Ar+50% $O_2$. Under these conditions, the sputtering operation was carried out for 30 minutes to form the epitaxial film 2. Various epitaxial films were formed on the $SrTiO_3$ substrate 1 by changing the Ba content z of the composition $Sr_{1-z}Ba_zTiO_3$ within a range of between 0 and 1.0. The epitaxial film 2 thus formed was analyzed by X-ray diffraction under room temperature, and the lattice constant was measured on the basis of the analytical data. FIG. 4 shows the relationship between the length of a-axis of the crystal and the composition of the epitaxial film 2. As seen from FIG. 4, the length of a-axis of the crystal of $Sr_{1-z}Ba_zTiO_3$ is increased with increase in the Ba content z of $Sr_{1-z}Ba_zTiO_3$. To be more specific, the length of a-axis was found to be 0.3904 nm in the case where Ba was not contained in the composition (z=0), and value was gradually increased to reach 0.3988 nm when the value of z was set at 1.0 (z=1.0).

In the next step, an oxide superconductor thin film 3 was formed on the epitaxial layer 2 by means of RF magnetron sputtering of $Sr_{0.8}Nd_{0.2}CuO_y$. The RF magnetron sputtering was carried out by using as a target a sintered pellet of $Sr_{0.8}Nd_{0.2}CuO_y$ having an outer diameter of 90 mm. The substrate temperature was set at 650° C. The pressure within the RF sputtering apparatus was set at 1.2 mTorr. The distance between the target and the substrate was set at 45 mm. The RF power was set at 100 W. Further, the gas introduced into the RF sputtering apparatus was Ar+5% $O_2$. Under these conditions, the sputtering operation was carried out for one hour to form the oxide superconductor thin film 3. The oxide superconductor thin film 3 thus formed was analyzed by X-ray diffraction under room temperature, and the lattice constant was measured on the basis of the analytical data.

Figure 5:
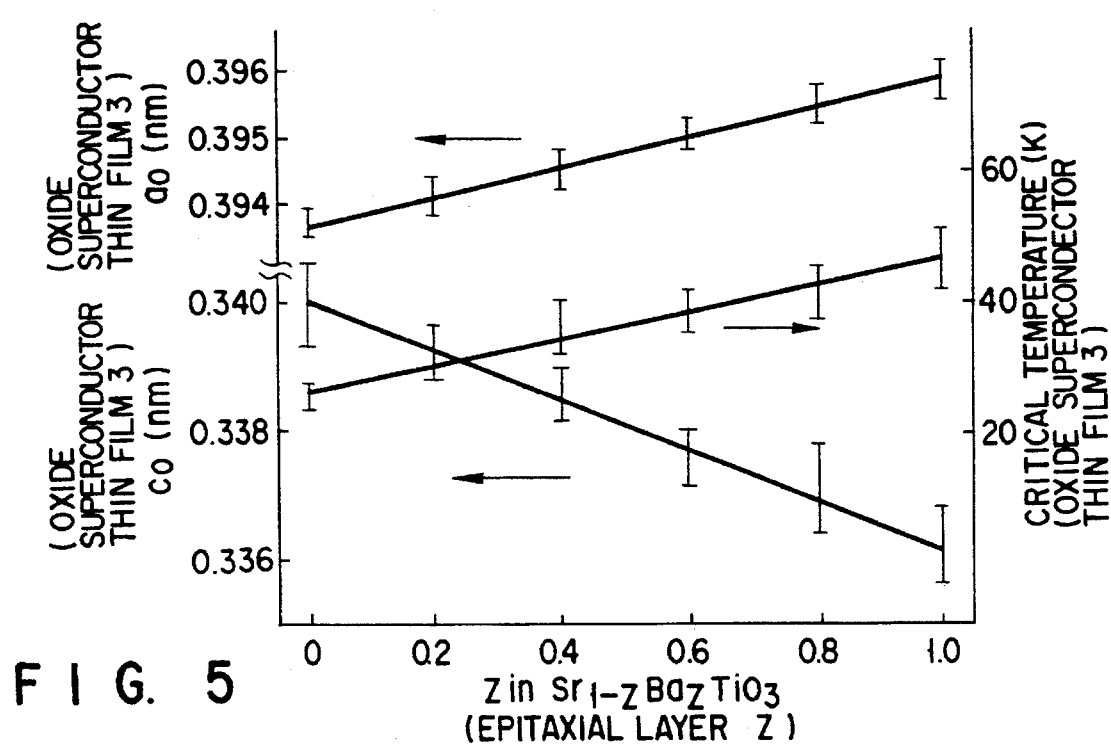
FIG. 5 is a graph showing the relationship among the critical temperature and the lattice constants, and the composition of $Sr_{0.8}Nd_{0.2}CuO_2$ epitaxial grown on an oxide superconductor $Sr_{1-z}Ba_zTiO_3$ (z falling within a range of between 0 and 1.0).

FIG. 5 shows the relationship among the critical temperature and the lattice constants of $Sr_{0.8}Nd_{0.2}CuO_2$, and the composition of an epitaxial film of $Sr_{1-z}Ba_zTiO_3$. The oxide superconductor $Sr_{0.8}Nd_{0.2}CuO_y$ was found to exhibit orientation along the c-axis. As apparent from FIG. 5, the length of a-axis of the crystal of $Sr_{0.8}Nd_{0.2}CuO_y$ was found to be increased with increase in the Ba content z of $Sr_{1-z}Ba_zTiO_3$ constituting the epitaxial layer 2. Likewise, the length of c-axis of the crystal of $Sr_{0.8}Nd_{0.2}CuO_y$ was found to be decreased with increase in the Ba content x of $Sr_{1-z}Ba_zTiO_3$ constituting the epitaxial layer 2. Further, the critical temperature of the oxide superconductor was found to be elevated with increase in the Ba content x of $Sr_{1-z}Ba_zTiO_3$ constituting the epitaxial layer 2. In other words, it is possible to control the critical temperature of the oxide superconductor thin film formed on an epitaxial film by controlling the composition of $Sr_{1-z}Ba_zTiO_3$ constituting the epitaxial layer 2.

As described above in detail, the present invention provides a method of manufacturing an oxide superconductor thin film, which permits easily obtaining an oxide superconductor thin film having a desired critical temperature without employing an element substitution. The method of the present invention makes it possible to obtain an oxide superconductor thin film exhibiting a critical temperature of a level which was not arrived at in the conventional bulk method.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of controlling a critical temperature of a thin film of an oxide superconductor said oxide superconductor being represented by general formula (I) given below:

$$A_{1-x}B_xCuO_y \qquad (I)$$

where "A" is at least one element selected from the group consisting of Ca, Sr and Ba, "B" is at least one rare earth element, "x" falls within a range of between 0 and 0.5, and "y" falls within a range of between 1.95 and 2.30, said oxide superconductor having a crystal structure of tetragonal system, the lattice constant in a-axis falling within a range of between 0.385 nm and 0.410 nm, and the lattice constant in c-axis being an integer number of times a value falling within a range of between 0.310 nm and 0.350 nm, said method comprising the steps of:
forming on a substrate, by epitaxial growth, a critical temperature control film with a crystal having a lattice constant which controls the critical temperature of the crystal of said oxide superconductor; and
forming on said critical temperature control film, by a thin film forming technique, a thin film made of the oxide superconductor having a critical temperature which is controlled by said critical temperature control film.

2. The method according to claim 1, wherein $SrTiO_3$ having a surface of (100) plane is used as said substrate.

3. The method according to claim 1, wherein said film formed of a crystal having a lattice constant close to that of the crystal of the oxide superconductor consists of a material selected from the group consisting of an oxide having a perovskite type crystal structure, and an oxide or fluoride having a crystal structure close to the perovskite structure.

4. The method according to claim 1, wherein said film formed of a crystal having a lattice constant close to that of the crystal of the oxide superconductor is selected from the group consisting of a film of $Sr_{1-z}Ba_zTiO_3$ and a film of $(Ln, Ln')_2CuO_4$ (where each of Ln and Ln' denotes a rare earth element).

5. The method according to claim 1, wherein a method selected from the group consisting of a sputtering method, a laser vapor deposition method, an MBE method and a CVD method is employed for forming said thin film.

6. A method of manufacturing an oxide superconductor thin film, comprising the steps of:

forming by epitaxial growth on a substrate a film of a material represented by (Ln, Ln')$_2$CuO$_4$ where each of Ln and Ln' denotes a rare earth element; and forming on said film a thin film of an oxide superconductor represented by Sr$_{1-x}$Nd$_x$CuO$_y$, where x falls within a range of between 0 and 0.5, and y falls within a range of between 1.95 and 2.30, said oxide superconductor having a crystal structure of tetragonal system, the lattice constant in a-axis falling within a range of between 0.385 nm and 0.410 nm, and the lattice constant in c-axis being an integer number of times as much as a level falling within a range of between 0.310 nm and 0.350 nm, and said oxide superconductor thin film being formed by a thin film forming technique.

7. The method according to claim 6, wherein SrTiO$_3$ having a surface of (100) plane is used as said substrate.

8. A method of manufacturing an oxide superconductor thin film, comprising the steps of:

forming by epitaxial growth on a substrate a film of a material represented by Sr$_{1-z}$Ba$_z$TiO$_3$; and forming on said film a thin film of an oxide superconductor represented by Sr$_{1-x}$Nd$_x$CuO$_y$, where x falls within a range of between 0 and 0.5, and y falls within a range of between 1.95 and 2.30, said oxide superconductor having a crystal structure of tetragonal system, the lattice constant in a-axis falling within a range of between 0.385 nm and 0.410 nm, and the lattice constant in c-axis being an integer number of times as much as a level falling within a range of between 0.310 nm and 0.350 nm, and said oxide superconductor thin film being formed by a thin film forming technique.

9. The method according to claim 8, wherein SrTiO$_3$ having a surface of (100) plane is used as said substrate.

10. A method of controlling a critical temperature of a thin film of an oxide superconductor represented by a general formula (I) given below:

$$A_{1-x}B_xCuO_y \qquad (I)$$

where "A" is at least one element selected from the group consisting of Ca, Sr and Ba, "B" is at least one rare earth element, "x" falls within a range of between 0 and 0.5, and "y" falls within a range of between 1.95 and 2.30, said oxide superconductor having a crystal structure of tetragonal system and a critical temperature corresponding to its lattice constant, the lattice constant in a-axis falling within a range of between 0.385 nm and 0.410 nm, and the lattice constant in c-axis being an integer number of times a value falling within a range of between 0.310 nm and 0.350 nm, said method comprising the steps of:
selecting a material having a lattice constant which controls the critical temperature of said oxide superconductor;
forming by epitaxial growth a critical temperature control film of said material on a substrate; and
forming by a thin film forming technique a thin film made of the oxide superconductor on said critical temperature control film.

11. The method according to claim 10, wherein the thin film of said oxide superconductor exhibits a critical temperature higher than that in the case of forming said thin film of said oxide superconductor directly on said substrate.

12. The method according to claim 10, wherein SrTiO$_3$ having a surface of (100) plane is used as said substrate.

13. The method according to claim 10, wherein said critical temperature control film is a film made of a material selected from the group consisting of an oxide having a perovskite type crystal structure and an oxide or fluoride having a crystal structure close to the perovskite structure.

14. The method according to claim 10, wherein said film formed of a crystal having lattice constants close to those of the crystal of the oxide superconductor is selected from the group consisting of a film of Sr$_{1-z}$Ba$_z$TiO$_3$ and a film of (Ln, Ln')$_2$CuO$_4$, where each of Ln and Ln' denotes a rare earth element.

15. The method according to claim 10, wherein a method selected from the group consisting of a sputtering method, a laser vapor deposition method, an MEB method and a CVD method is employed for forming said thin film.

16. A method of controlling a critical temperature of an oxide superconductor thin film, said oxide superconductor being presented by general formula (I) given below:

$$A_{1-x}B_xCuO_y \qquad (I)$$

where "A" is at least one element selected from the group consisting of Ca and Ba, "B" is at least one rare earth element, "x" falls within a range of between 0 and 0.5, and "y" falls within a range of between 1.95 and 2.30, said oxide superconductor having a crystal structure of tetragonal system, the lattice constant in a-axis falling within a range of between 0.385 nm and 0.410 nm, and the lattice constant in c-axis being an integer number of times a value falling within a range of between 0.310 nm and 0.350 nm, said method comprising the steps of:
forming on a substrate a film of a crystal having a lattice constant which controls the critical temperature of the crystal of an oxide superconductor having a specific formula chosen from said general formula, by epitaxial growth; and
forming on said film a thin film made of said oxide superconductor having the specific formula, by a thin film forming technique.

17. A method of controlling a critical temperature of an oxide superconductor thin film, said oxide superconductor being presented by general formula (I) given below:

$$A_{1-x}B_xCuO_y \qquad (I)$$

where "A" is at least one element selected from the group consisting of Ca, Sr and Ba, "B" is at least one rare earth element except for Nd, "x" falls within a range of between 0 and 0.5, and "y" falls within a range of between 1.95 and 2.30, said oxide superconductor having a crystal structure of tetragonal system, the lattice constant in a-axis falling within a range of between 0.385 nm and 0.410 nm, and the lattice constant in c-axis being an integer number of times a value falling within a range of between 0.310 nm and 0.350 nm, said method comprising the steps of:
forming on a substrate a film of a crystal having a lattice constant which controls the critical temperature of the crystal of an oxide superconductor having a specific formula chosen from said general formula, by epitaxial growth; and
forming on said film a thin film made of said oxide superconductor having the specific formula, by a thin 18. A method of manufacturing an oxide superconductor thin film, said oxide superconductor being presented by general formula (I) given below:

$$A_{1-x}B_xCuO_Y \qquad (I)$$

where "A" is at least one element selected from the group consisting of Ca and Ba, "B" is at least one rare earth element, "x" falls within a range of between 0 and 0.5, and "y" falls within a range of between 1.95 and 2.30, said oxide superconductor having a crystal structure of tetragonal system, the lattice constant in a-axis falling within a range of between 0.385 nm and 0.410 nm, and the lattice constant in c-axis being an integer number of times a value falling with a range of between 0.310 nm and 0.350 nm, said method comprising the steps of:

forming a $Sr_{1-z}Ba_zTiO_3$ film on a substrate by epitaxial growth; and forming on said $Sr_{1-z}Ba_zTiO_3$ film a thin film made of said oxide superconductor, by a thin film forming technique.

19. A method of manufacturing an oxide superconductor thin film, said oxide superconductor being presented by general formula (I) given below:

$$A_{1-x}B_xCuO_Y \qquad (I)$$

where "A" is at least one element selected from the group consisting of Ca and Ba, "B" is at least one rare earth element, "x" falls within a range of between 0 and 0.5, and "y" falls within a range of between 1.95 and 2.30, said oxide superconductor having a crystal structure of tetragonal system, the lattice constant in a-axis falling within a range of between 0.385 nm and 0.410 nm, and the lattice constant in c-axis being an integer number of times a value falling within a range of between 0.310 nm and 0.350 nm, said method comprising the steps of:

forming a $(Ln,Ln')_2CuO_4$ (Ln and Ln' represent rare earth elements) film on a substrate by epitaxial growth; and forming on said $(Ln,Ln')_2CuO_4$ film a thin film made of said oxide superconductor, by a thin film forming technique.

* * * * *